(12) United States Patent
Chen

(10) Patent No.: US 9,379,167 B2
(45) Date of Patent: Jun. 28, 2016

(54) LIGHT EMITTING DEVICE AND METHOD FOR MANUFACTURING THE SAME

(71) Applicant: BOE TECHNOLOGY GROUP CO., LTD., Beijing (CN)

(72) Inventor: Min Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 13/981,021

(22) PCT Filed: Oct. 29, 2012

(86) PCT No.: PCT/CN2012/083713
§ 371 (c)(1),
(2) Date: Jul. 22, 2013

(87) PCT Pub. No.: WO2014/008719
PCT Pub. Date: Jan. 16, 2014

(65) Prior Publication Data
US 2014/0070190 A1 Mar. 13, 2014

(30) Foreign Application Priority Data
Jul. 13, 2012 (CN) .......................... 2012 1 0244665

(51) Int. Cl.
*H01L 27/32* (2006.01)
*H01L 35/34* (2006.01)
(Continued)

(52) U.S. Cl.
CPC .......... *H01L 27/3225* (2013.01); *H01L 35/325* (2013.01); *H01L 35/34* (2013.01); *H01L 51/56* (2013.01); *H01L 23/38* (2013.01); *H01L 51/529* (2013.01); *H01L 2924/0002* (2013.01)

(58) Field of Classification Search
CPC ......... H01L 23/38; H01L 27/16; H01L 27/18; H01L 35/28; H01L 33/645; H01L 35/00; H01L 27/3225; H01L 35/34; H01L 51/56; H01L 35/325; H01L 51/529

USPC .................. 257/930, E27.008, 717, E23.082, 257/E33.075

See application file for complete search history.

(56) References Cited

U.S. PATENT DOCUMENTS 7,299,639 B2 * 11/2007 Leija et al. ........................ 62/3.2
7,838,986 B2 * 11/2010 Tsao et al. .................... 257/712
(Continued)

FOREIGN PATENT DOCUMENTS

CN          1748328 A       3/2006
CN        101009362 A       8/2007
(Continued)

OTHER PUBLICATIONS

Goncalves, Fabrication of flexible thermoelectric microcoolers using planar thin-film technologies, J. Micromech. Microeng. 17 (2007)S168-S173.*
(Continued)

*Primary Examiner* — Latanya N Crawford
(74) *Attorney, Agent, or Firm* — Ladas & Parry LLP

(57) ABSTRACT

There are provided a light emitting device and a method for manufacturing the same, which may effectively improve heat dissipation of the light emitting device and extend service life thereof. The light emitting device comprises a substrate (1) on which a light emitting section (2) is disposed, and the light emitting device further have a semiconductor thermoelectric refrigerating section (3) integrated thereon which is disposed on the light emitting section (2); the semiconductor refrigerating section (3) comprises a cold end (31) close to the light emitting section (2) and a hot end (32) away from the light emitting section (2).

11 Claims, 3 Drawing Sheets

(51) Int. Cl.
*H01L 51/56* (2006.01)
*H01L 35/32* (2006.01)
*H01L 23/38* (2006.01)
*H01L 51/52* (2006.01)

(56) References Cited

U.S. PATENT DOCUMENTS

| | | | |
|---|---|---|---|
| 7,893,529 B2* | 2/2011 | Hsu et al. | 257/713 |
| 2004/0238966 A1* | 12/2004 | Bottner et al. | 257/772 |
| 2005/0002818 A1* | 1/2005 | Ichikawa et al. | 419/6 |
| 2006/0237730 A1* | 10/2006 | Abramov | 257/81 |
| 2008/0006843 A1 | 1/2008 | Dai et al. | |
| 2008/0236643 A1* | 10/2008 | Li | 136/203 |
| 2009/0026946 A1* | 1/2009 | Satake | 313/512 |
| 2009/0051272 A1* | 2/2009 | Fukuda et al. | 313/504 |
| 2009/0085454 A1 | 4/2009 | Li et al. | |
| 2009/0090409 A1* | 4/2009 | Moczygemba | 136/201 |
| 2009/0152666 A1* | 6/2009 | Luo | 257/470 |
| 2009/0153007 A1* | 6/2009 | Jiang | 313/11 |
| 2009/0205696 A1* | 8/2009 | Koester et al. | 136/201 |
| 2010/0207573 A1* | 8/2010 | Mo | F21V 29/763 320/101 |
| 2010/0290201 A1* | 11/2010 | Takeuchi et al. | 361/752 |
| 2011/0127562 A1* | 6/2011 | Sung | H01L 23/3735 257/99 |
| 2011/0260800 A1* | 10/2011 | Shanfield et al. | 331/70 |

FOREIGN PATENT DOCUMENTS

| | | | |
|---|---|---|---|
| CN | 102130076 A | 7/2011 | |
| CN | 102299265 A | 12/2011 | |
| KR | 2005093383 | * 9/2005 | H05B 33/04 |

OTHER PUBLICATIONS

English translation of KR2005093383—Application No. 10-2004-0018705.*
International Search Report mailed Apr. 18, 2013; PCT/CN2012/083713.
First Chinese Office Action dated May 5, 2014; Appln. No. 201210244665.8.
International Preliminary Report on Patentability Appln. No. PCT/CN2012/083713; Dated Jan. 13, 2015.
Second Chinese Office Action dated Dec. 23, 2014; Appln. No. 201210244665.8.
Third Chinese Office Action dated May 25, 2015; Appln. No. 201210244665.8.

* cited by examiner

Series Two-stage Thermoelectric Piles

Parallel Two-stage Thermoelectric Piles

Parallel-Serial Three-stage Thermoelectric Piles

LIGHT EMITTING DEVICE AND METHOD FOR MANUFACTURING THE SAME

TECHNICAL FIELD

Embodiments of the present invention relate to a light emitting device and a method for manufacturing the same.

BACKGROUND

Organic Light-Emitting Diodes (OLEDs) may be used for the third generation display technology after the liquid crystal display technology and find extensive applications in various fields such as display panel, lighting and backlight.

Organic materials in OLEDs are sensitive to oxygen and are prone to react with oxygen once contacting it, thereby deteriorating performance of OLEDs. In order to prevent this case from occurring, glass is typically used to clad the entire light emitting part of an OLED. Cladding with glass can avoid contact between organic materials in an OLED and oxygen; however, there is a gap left between the OLED and the cladding glass, and the glass itself is not a good heat-conducting material. Therefore, heat generated during operation of the OLED is not readily to be transferred out, in which case damage can be coursed to the OLED due to overheating, hence impacting the service life of the OLED.

SUMMARY

Embodiments of the present invention provide a light emitting device and a method for manufacturing the same, which can effectively improve heat dispersion of the light emitting device and thus extend service life thereof.

In one aspect, an embodiments of the present invention provides a light emitting device comprising a substrate on which a light emitting section is disposed; and the light emitting device further comprising a semiconductor thermoelectric refrigerating section integrated thereon which is disposed on the light emitting section.

In another aspect, an embodiment of the present invention provides a method for manufacturing the above-mentioned light emitting device comprising steps of: preparing a light emitting section on a substrate; preparing a semiconductor thermoelectric refrigerating section on the substrate on which the light emitting section has been prepared; and packaging the substrate with a light emitting section and a semiconductor thermoelectric refrigerating section prepared thereon.

With the light emitting device and the method for manufacturing the same according to embodiments of the present invention, the light emitting device comprises a semiconductor thermoelectric refrigerating section integrated therein which, utilizing the thermoelectric effect principle, absorbs and dissipates heat generated by the light emitting section while the light emitting section is working to lower temperature of the light emitting section in operation. Therefore, it is possible to effectively improve heat dissipation of the light emitting device and thus extend service life of the light emitting device.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," or the like, which are used in the description and the claims of the present application for invention, are not intended to indicate any sequence, amount or importance, but distinguish various components. Also, the terms such as "a," "an," "the" or the like are not intended to limit the amount, but indicate the existence of at lease one. The phrases "connect", "connected", or the like are not intended to define a physical connection or mechanical connection, but may include an electrical connection, directly or indirectly. "On," "under," "right," "left" and the like are only used to indicate relative position relationship, and when the position of the object which is described is changed, the relative position relationship is changed accordingly.

Figure 1:
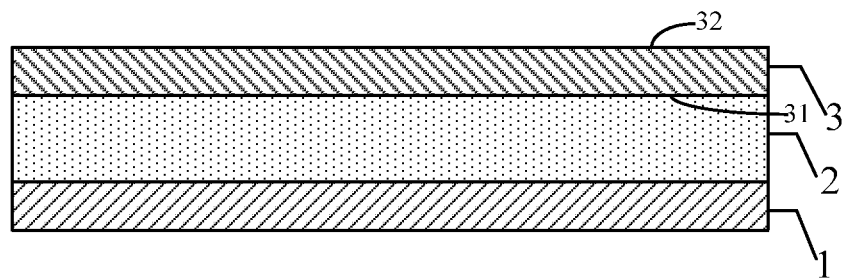
FIG. 1 is a structural representation of a light emitting device provided in an embodiment of the present invention.

A light emitting device is provided in one embodiment of the present invention. As shown in FIG. 1, the light emitting device provided in the embodiment of the present invention includes a substrate 1 on which a light emitting section 2 is provided; and the light emitting device also has integrated therein a semiconductor thermoelectric refrigerating section 3 provided on the light emitting section 2.

The semiconductor thermoelectric refrigerating section 3 is a component refrigerating with a semiconductor thermoelectric material based on the Peltier Effect (i.e. Thermoelectric Effect) principle and includes a cold end 31 and a hot end 32. The cold end 31 is close to the light emitting section 2 for absorbing heat generated by the light emitting section 2, while the hot end 32 is away from the light emitting section 2 for dissipating heat absorbed by the cold end 31.

In the light emitting device provided in the embodiment of the present invention, the semiconductor thermoelectric refrigerating section 3 is integrated in the light emitting device, which is directly made on the light emitting section 2 and can obtain good refrigerating effect.

With the light emitting device provided in the embodiment of the present invention, when the light emitting section 2 is working, the semiconductor thermoelectric refrigerating section 3 absorbs and dissipates heat generated by the light emitting section 2 to thereby lower the temperature of the light emitting section 2 in operation. Therefore, the heat dissipation performance of the light emitting device can be effectively improved and the service life of the light emitting device can be extended.

Figure 2:
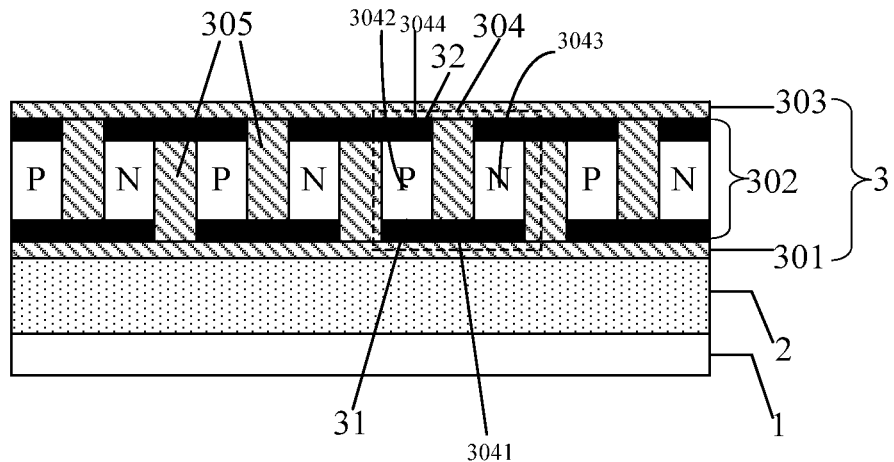
FIG. 2 is a structural representation of a light emitting device provided in an embodiment of the present invention.

For example, in one example of the embodiment of the present invention, as shown in FIG. 2, the semiconductor thermoelectric refrigerating section 3 includes a first electrically insulating and thermally conducting layer 301, a semiconductor thermopile layer 302, and a second electrically insulating and thermally conducting layer 303; the first electrically insulating and thermally conducting layer 301 is disposed on the light emitting section 2, the semiconductor thermopile layer 302 is disposed on the first electrically insulating and thermally conducting layer 301, and the second electrically insulating and thermally conducting layer 303 is disposed on the semiconductor thermopile layer 302.

The semiconductor thermopile layer 302 includes at least one semiconductor refrigerating unit 304 (indicated by the dashed box). Each semiconductor refrigerating unit 304 includes a metal bottom electrode 3041, a P-type semiconductor 3042, an N-type semiconductor 3043 and a metal upper electrode 3044; the metal bottom electrode 3041 is disposed on the first electrically insulating and thermally conducting layer 301, the P-type semiconductor 3042 and the N-type semiconductor 3043 are disposed on the metal bottom electrode 3041, and the metal upper electrode 3044 is disposed on the top of the P-type semiconductor and the N-type semiconductor.

In the example shown in FIG. 2, the bottom of the P-type semiconductor 3042 and the bottom of the N-type semiconductor 3043 of the same semiconductor refrigerating unit 304 are connected via the metal bottom electrode 3041; and when the semiconductor thermopile layer 302 includes a plurality of semiconductor refrigerating units 304, the metal upper electrode 3044 is adapted for connecting adjacent semiconductor refrigerating units 304 together.

When a direct current flows from the N-type semiconductor 3043 to the P-type semiconductor 3044, based on the Peltier Effect, the part where the N-type semiconductor 3043 contacts the metal bottom electrode 3041 and the P-type semiconductor 3042 contacts the metal bottom electrode 3041 absorbs heat, which part is called as a cold end. The part where the N-type semiconductor 3043 contacts the metal upper electrode 3044 and the P-type semiconductor 3042 contacts the metal upper electrode 3044 dissipates heat, which part is called as a hot end. When the light emitting element shown in FIG. 2 is working, heat generated by the light emitting section 2 is passed through the first electrically insulating and thermally conducting layer 301 to the cold end that absorbs the heat, while the hot end dissipates the heat absorbed by the cold end, which is passed through the second electrically insulating and thermally conducting layer 303 to the outside of the light emitting element.

Figure 3:
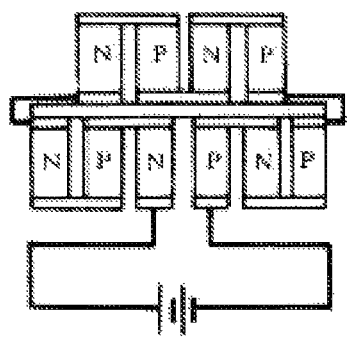
FIGS. 3(a)-(c) are principle schematic diagrams of connecting modes for a semiconductor refrigerating unit in the light emitting device provided in embodiments of the present invention.
Figure 3:
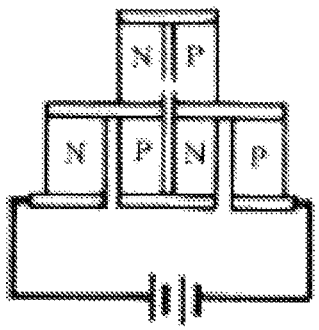
Figure 3:
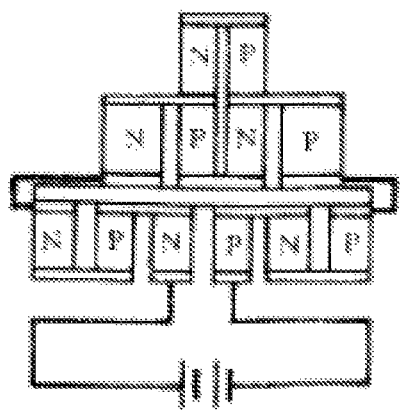

Preferably, in the embodiment of the present invention, in order to effectively enhance refrigerating effect, the semiconductor thermopile layer 302 includes a plurality of (two or more than two) semiconductor refrigerating units 304. In some examples, the plurality of semiconductor refrigerating units 304 may be distributed in an array. As shown in FIGS. 3(a) to 3(c), the plurality of semiconductor refrigerating units 304 may be connected in series, in parallel or combination thereof to form a multi-stage thermopile that enlarges areas of the cold end and hot end, hence realizing better refrigerating effect. In the present embodiment, connections among a plurality of semiconductor refrigerating units 304 are implemented by the metal upper electrode 3044.

Referring to FIG. 3(a), the plurality of semiconductor refrigerating units are distributed in two columns and the two columns of semiconductor refrigerating units are connected in series. The current entirely passes every semiconductor refrigerating unit rather than being shunted, and the current flowing through each refrigerating unit is from the N-type semiconductor to the P-type semiconductor.

Referring to FIG. 3(b), the plurality of semiconductor refrigerating units are divided into two columns and the two columns of semiconductor refrigerating units are connected in parallel. After being divided, the current flow through the two columns of semiconductor refrigerating units respectively, and the current flowing through each refrigerating unit is from the N-type semiconductor to the P-type semiconductor.

Referring to FIG. 3(c), combined series-parallel connection refers to including both series connection from column to column and parallel connection of column and column.

It is to be noted that FIGS. 3(a) to 3(c) are only principle schematic diagram of connections among a plurality of semiconductor refrigerating units 304, which do not represent the number of and the real connections among semiconductor refrigerating units of the present embodiment. For example, each column of semiconductor refrigerating units may include one or more semiconductor refrigerating units and a plurality of columns of semiconductor refrigerating units may be distributed in the semiconductor thermopile layer 302. Those skilled in the art may select the number of semiconductor refrigerating units and/or the number of columns and implement series connection, parallel connection or series-parallel combined connection of the plurality of semiconductor refrigerating units with the metal upper electrode 3044 according to the connection principle of FIGS. 3(a) to 3(c), which will not be further descried herein.

In this embodiment, insulating isolation sections 305 may be disposed between the P-type semiconductor 3042 and the N-type semiconductor 3043 of same one semiconductor refrigerating unit 304 as well as between adjacent semiconductor refrigerating units 304 to effectively ensure electrical performance of semiconductor refrigerating units 304.

In this embodiment, the materials for the first electrically insulating and thermally conducting layer 301 and the second electrically insulating and thermally conducting layer 303 may be the same or different, and since both are used for conducting heat, the materials for them are preferably inorganic materials with high thermal conductivity. Optionally, the materials for the first electrically insulating and thermally conducting layer 301 and the second electrically insulating and thermally conducting layer 303 may be selected from diamond-like carbon, aluminum nitride, boron nitride, silicon nitride, aluminum oxide and magnesium oxide. Furthermore, the materials for the first electrically insulating and thermally conducting layer 301 and the second electrically insulating and thermally conducting layer 303 may be the same or different. Optionally, the first electrically insulating and thermally conducting layer and second electrically insulating and thermally conducting layer 302 have a thickness of 100-5000 nm.

In the present embodiment, the material for the P-type semiconductor 3042 may be one or combination of more: bismuth telluride binary solid solution ($B_2Te_3$—$Sb_2Te_3$), bismuth telluride ternary solid solution ($Bi_2Te_3$—$Sb_2Te_3$—$Sb_2Se_3$), P-type Ag(1-x)Cu(x)TiTe, and YBaCuO superconducting material.

In the present embodiment, the materials for the N-type semiconductor 3043 may be one or any combination thereof from: bismuth telluride binary solid solution ($B_2Te_3$—$Sb_2Te_3$), bismuth telluride ternary solid solution ($Bi_2Te_3$—$Sb_2Te_3$—$Sb_2Se_3$), N-type Bi—Sb alloy, and YBaCuO superconducting material.

The bismuth telluride ternary solid solution increases forbidden energy gap of the solid solution material relative to the bismuth telluride binary solid solution, which may further lower the lattice thermal conductivity.

In the present embodiment, the materials for the metal upper electrode 3044 and the metal bottom electrode 3041 may be the same or different, and may be one selected from silver, copper, gold and aluminum and the thicknesses of them may be the same or different, e.g., 50-1000 nm for both.

It is to be noted that the light emitting devices provided in embodiments of the present invention may be OLEDs, inorganic light-emitting diodes, organic solar cells, inorganic solar cells, organic thin film transistors, inorganic thin film transistors and photodetectors, which is not limited in the present invention.

Correspondingly, an embodiment of the present invention further provides a method for manufacturing the above-mentioned light emitting device including the following steps.

Step 10, preparing a light emitting section on a substrate.

This step may be for example accomplished with relevant steps of a conventional technology, which will not be further described herein.

Step 11, preparing a semiconductor thermoelectric refrigerating section on the substrate on which the light emitting section has been prepared.

Taking the preparation of the light emitting device according to the embodiment shown in FIG. 2 as an example, the step 11 may include, e.g., the following steps.

First, a first electrically insulating and thermally conducting layer is deposited on the light emitting section.

For example, the first electrically insulating and thermally conducting layer may be deposited by vacuum evaporation, magnetron sputtering, ion plating, direct-current sputter coating, radio frequency sputtering coating, ion beam sputtering coating, ion beam assisted deposition, plasma enhanced chemical vapor deposition, high density inductive coupling plasma source chemical vapor deposition, ionized cluster beam deposition, metal-organic chemical vapor deposition, catalyst chemical vapor deposition, laser pulse deposition, pulsed plasma method, pulsed laser method, electron beam evaporation, sol-gel method, ink jet printing, electroplating, which is not limited in the present invention.

Then, a metal bottom electrode is prepared with a shadow mask process on the first electrically insulating and thermally conducting layer.

In the shadow mask process, the location where the metal bottom electrode is to be formed is exposed with the shadow mask, while other locations are masked, which allows to prepare the metal bottom electrode only at the location exposed by the shadow mask, and locations masked maintain intact. Other shadow mask processes used herein below have the same principle as this.

For example, the metal bottom electrode may be prepared by vacuum evaporation, magnetron sputtering, ion plating, direct-current sputter coating, radio frequency sputtering coating, ion beam sputtering coating, ion beam assisted deposition, plasma enhanced chemical vapor deposition, high density inductive coupling plasma source chemical vapor deposition, ionized cluster beam deposition, metal-organic chemical vapor deposition, catalyst chemical vapor deposition, laser pulse deposition, pulsed plasma method, pulsed laser method, electron beam evaporation, sol-gel method, ink jet printing, electroplating, which is not limited in the present invention.

Subsequently, a P-type semiconductor and an N-type semiconductor are prepared respectively by shadow mask process on the metal bottom electrode.

The order in which the P-type semiconductor and the N-type semiconductor are prepared is not limited. The P-type semiconductor may be first prepared, and then the N-type semiconductor is prepared, or vice versa. For example, the P-type semiconductor and the N-type semiconductor may be formed by one or more of metal-organic chemical vapor deposition (MOCVD), pulsed laser deposition (PLD), molecular beam epitaxial growth (MBE), magnetron sputtering (MS), ion beam sputtering (IBS), Co-evaporation, and Flash evaporation, which is not limited in the present invention.

Subsequently, a metal upper electrode is prepared with a shadow mask process on the P-type semiconductor and the N-type semiconductor. The preparation of the metal upper electrode may be the same as that of the metal bottom electrode, which will not be further described any more here.

Then, on the metal upper electrode, the second electrically insulating and thermally conducting layer is deposited. The preparation of the second electrically insulating and thermally conducting layer may be the same as that of the first electrically insulating and thermally conducting layer, which will not be further described herein.

It is noted that, in one embodiment of the present invention, in order to ensure electrical performance of the light emitting device and effectively avoid electrical failures such as short circuit, after preparing the P-type semiconductor and the N-type semiconductor and before preparing the metal upper electrode, the manufacturing method further includes the following steps.

An insulating isolation section is deposited with a shadow mask process between the P-type semiconductor and the N-type semiconductor of same one semiconductor refrigerating unit and between adjacent semiconductor refrigerating units 304.

Step 12, packaging the substrate with a light emitting section and a semiconductor thermoelectric refrigerating section prepared thereon.

Optionally, in this step, various packaging approaches such as a metal foil, a glass package cover and a composite film may be applied, and a hybrid packaging approach may applied as well. The hybrid packaging refers to packaging with at least two types of packaging approaches, such as applying both a metal foil package and a glass cover-plate on the metal foil.

To better explain the light emitting device and the method for manufacturing the same provided in embodiments of the present invention, detail description will be given with an OLED as light emitting device as an example. In the following embodiments, the light emitting device is an OLED. However, the present invention is not limited thereto. For example, it may be an LED made from inorganic semiconductor materials.

Figure 4:
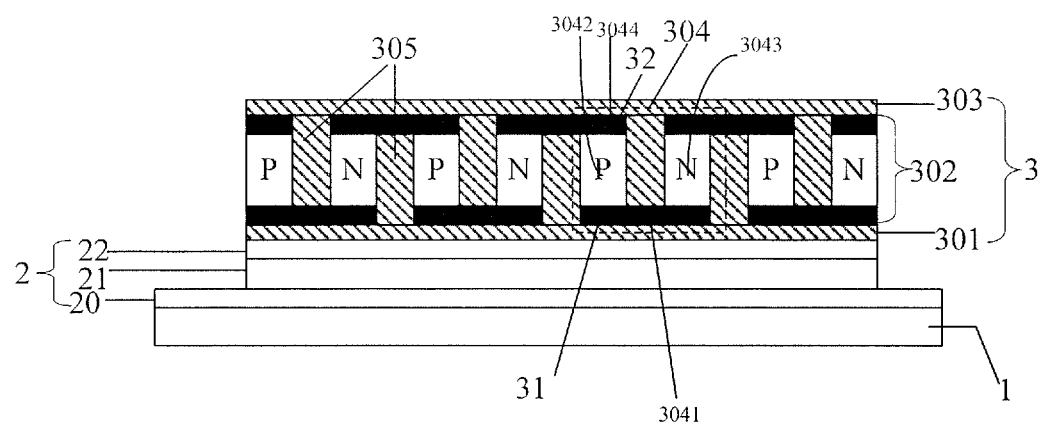
FIG. 4 is a structural representation of a light emitting device that is OLED provided in an embodiment of the present invention.

As shown in FIG. 4, the OLED includes a substrate 1, on the substrate 1 a light emitting section 2 is disposed, and on the light emitting section 2 a semiconductor thermoelectric refrigerating section 3 is disposed. The light emitting section 2 includes an anode layer 20 disposed on the substrate 1, an organic function layer 21 disposed on the anode layer 20, and a metal electrode layer 22 disposed on the organic function layer 21. The semiconductor thermoelectric refrigerating section 3 has a same structure with that in the embodiment shown in FIG. 2, which will not be further describe herein; the first electrically insulating and thermally conducting layer 301 is disposed on the metal electrode layer 22.

The substrate 1 has good light transmittance in a visible light zone, certain resistance against vapor and oxygen penetration, and good surface flatness. The substrate 1 may be a glass or flexible substrate, and the flexible substrate may use a material from polyester, poly-phthalimide compound or thin metal.

The anode layer 20, as a connection layer for forward voltage of the organic light-emitting diode, uses inorganic metal oxide such as indium tin oxide (ITO), zinc oxide (ZnO), an organic conductive polymer such as PEDOT:PSS, PANI or a high work function metallic material such as gold, copper, silver and platinum.

The metal electrode layer 22, as a connection layer for backward voltage of the device, is for example a low work function metallic material such as lithium, magnesium, calcium, strontium, aluminum and indium or any alloy of them with copper, gold and silver, or includes a thin layer of buffering insulating layer such as LiF and MgF2 and any aforementioned metal or alloy.

Embodiment 1

As shown in FIG. 4, in the OLED in this embodiment, the anode layer 20 is an ITO layer, the metal electrode layer 22 is a Mg:Ag alloy layer, and the first electrically insulating and thermally conducting layer 301 and the second electrically insulating and thermally conducting layer 303 is a diamond-like carbon layer with a thickness of about 500 nm; the metal upper electrode 3044 and the metal bottom layer 3041 are of Al, with a thickness of 1000 nm; the P-type semiconductor 3042 is of $Bi_2Te_3$—$Sb_2Te_3$, the N-type semiconductor 3043 is of $Bi_2Te_3$—$Bi_2Se_3$, both with a thickness of about 1500 nm.

The method for manufacturing the OLED may include the following steps:

1. The anode layer 20, the organic function layer 21 and the metal electrode layer 22 are successively formed on the substrate 1 to form the light emitting section 2.

2. With a vacuum magnetic filtering technique, a lower frequency periodic negative bias is applied to the substrate 1 with the anode layer 20, the organic function layer 21 and the metal electrode layer 22 formed thereon, and a diamond-like carbon film (the first electrically insulating and thermally conducting layer 301) is deposited on the metal electrode layer 22 under room temperature.

For example, in the magnetic filtering plasma apparatus for forming the diamond-like carbon film, highly pure graphite is used as cathode, the base vacuum in the vacuum chamber is on the order of $10^{-3}$ Pa, the arc current is 70 A, the arc voltage is 20V, the filtering magnetic field current is 20 A, which can generate a magnetic field of 40 mT, 99.999% highly pure argon is used as the working gas with the gas flow controlled at 1.5 sccm, the periodic bias is (0, −50V), the deposition time is 60 minutes, and the distance between the substrate 1 and the highly pure graphite cathode is 30 cm.

For example, in this step, the diamond-like carbon film is formed with a thickness of 500 nm and with a dense and smooth surface, with a surface roughness less than 1 nm.

3. On the diamond-like carbon film formed in step 2, with a shadow mask process, a layer of dense high thermal conductivity Al metal array (a plurality of metal bottom electrodes 3041) is formed on the diamond-like carbon film with a magnetron sputtering method.

The Al metal array is used to connect the P-type semiconductor and the N-type semiconductor in each semiconductor refrigerating unit 304.

4. On the Al metal array formed in step 3, with a shadow mask process, a P-type semiconductor array (a plurality of P-type semiconductor 3042) is formed with a radio frequency magnetron sputtering method.

For example, the target for the radio frequency magnetron sputtering is a binary solid solution alloy $Bi_2Te_3$—$Sb_2Te_3$, the sputtering power is 100 W, the sputtering atmospheric pressure is 3 Pa (Ar pressure), the sputtering time is 60 minutes, and the film thickness is 1500 nm.

5. On the Al metal array formed in step 3, with a shadow mask process, an N-type semiconductor array (a plurality of N-type semiconductor 3042) is formed with a radio frequency magnetron sputtering method.

For example, the target for the radio frequency magnetron sputtering is a binary solid solution alloy $Bi_2Te_3$—$Sb_2Se_3$, the sputtering power is 120 W, the sputtering atmospheric pressure is 2 Pa (Ar pressure), the sputtering time is 40 minutes, and the film thickness is 1500 nm.

6. A diamond-like carbon film array is formed with a shadow mask process to form the insulating isolation sections in gaps between the P-type semiconductor and the N-type semiconductor of same one semiconductor refrigerating unit and between adjacent semiconductor refrigerating units 304.

In this step, the adopted process parameters may be the same as step 2. Of course, those skilled in the art may select other process parameters, for which further detailed description is omitted herein.

7. With a shadow mask process, an Al metal array (a plurality of metal upper electrodes 3044) is formed on the P-type semiconductor array and the N-type semiconductor array with a magnetron sputtering method.

The Al metal array is configured to connect adjacent semiconductors of adjacent semiconductor refrigerating units 304 to realize series connection, parallel connection or series-parallel combined connection of multiple semiconductor refrigerating units 304.

8. In the Al metal array prepared in step 7, a diamond-like carbon film is formed (the second electrically insulating and thermally conducting layer 303).

In this step, same process parameters as those in step 2 are adopted, which will not be further described.

Figure 2A:
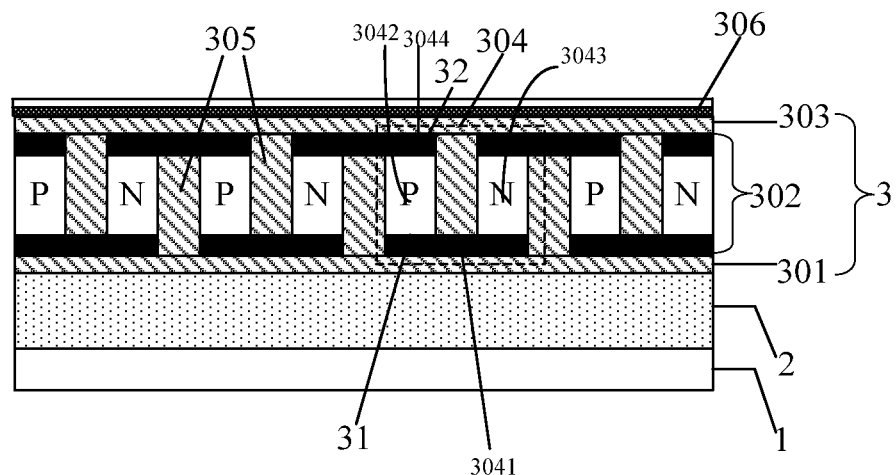
FIG. 2a is a structural representation of a light emitting device provided in another embodiment of the present invention.

Furthermore, in order to enhance sealing effect, steps 7 and 8 may be repeated for many times to form a multi-layer composite film sealing layer, for example, the multi-layer composite film sealing layer 306 as shown in FIG. 2a. Then it is possible to form a dense high thermal conductivity Al metal layer on the diamond-like carbon layer prepared in step 8 with magnetron sputtering, which forms a sealing layer together with the diamond-like carbon film for blocking corrosion of OLED by water and oxygen and further enhancing toughness of the composite sealing layer. In order to protect the prepared metal layer, a diamond-like carbon film is further formed on the metal layer, which is repeated for many times to form a multi-layer composite film structure sealing layer.

Embodiment 2

As shown in FIG. 4, in the OLED in this embodiment, the anode layer 20 is an ITO layer, the metal electrode layer 22 is a Mg:Ag alloy layer, and the first electrically insulating and thermally conducting layer 301 and the second electrically insulating and thermally conducting layer 303 each are an aluminum nitride layer with a thickness of about 500 nm; the metal upper electrode 3044 and the metal bottom layer 3041 are of Al, with a thickness of 1000 nm; the P-type semiconductor 3042 is of $Bi_2Te_3$—$Sb_2Te_3$, and the N-type semiconductor 3043 is of $Bi_2Te_3$—$Bi_2Se_3$, both with a thickness of about 1500 nm.

The method for manufacturing the OLED may include the following steps:

1. The anode layer 20, the organic function layer 21 and the metal electrode layer 22 are successively formed on the substrate 1 to complete the light emitting section.

2. An aluminum nitride film (the first electrically insulating and thermally conducting layer 301) is grown on the metal electrode layer 22 by radio frequency reactive magnetron sputtering 2.

For example, in the magnetron sputtering apparatus, the vacuum degree in the process chamber is $3\times10^{-4}$ Pa, the sputtering target is an 99.99% Al target, the working gas is 99.99% Ar and 99.99% $N_2$, the partial pressure ratio between Ar and $N_2$ is kept at 24:4 throughout the process, the target-substrate distance is 7.0 cm, the temperature of substrate 1 is 20° C. (room temperature), the power is 40 W, and the sputtering time is 60 minutes.

Furthermore, preferably, prior to sputtering the film, the target is pre-sputtered for 15 minutes with a power of 30 W to remove impurity such as oxides on the surface of the Al target.

3. Using shadow mask process, a layer of dense high thermal conductivity Al metal array (a plurality of metal bottom electrodes 3041) is formed on the aluminum nitride film formed in step 2 with a magnetron sputtering method.

4. On the Al metal array formed in step 3, with a shadow mask process, a P-type semiconductor array (a plurality of P-type semiconductor 3042) is formed with a radio frequency magnetron sputtering method.

For example, the target for the radio frequency magnetron sputtering is a binary solid solution alloy $Bi_2Te_3$—$Sb_2Te_3$, the sputtering power is 100 W, the sputtering atmospheric pressure is 3 Pa (Ar pressure), the sputtering time is 60 minutes, and the film thickness is 1500 nm.

5. On the Al metal array formed in step 3, with a shadow mask process, an N-type semiconductor array (a plurality of N-type semiconductor 3042) is formed with a radio frequency magnetron sputtering method.

For example, the target for the radio frequency magnetron sputtering is a binary solid solution alloy $Bi_2Te_3$—$Sb_2Se_3$, wherein the sputtering power is 120 W, the sputtering atmospheric pressure is 2 Pa (Ar pressure), the sputtering time is 40 minutes, and the film thickness is 1500 nm.

6. A aluminum nitride thin film array is formed with a shadow mask process to form the insulating isolation sections in gaps between the P-type semiconductor and the N-type semiconductor of same one semiconductor refrigerating unit and between adjacent semiconductor refrigerating units 304.

In this step, the adopted process parameters may be the same as step 2. Of course, those skilled in the art may select other process parameters, for which further detailed description is omitted here.

7. With a shadow mask process, an Al metal array (a plurality of metal upper electrodes 3044) is formed on the P-type semiconductor array and the N-type semiconductor array with a magnetron sputtering method.

8. On the Al metal array prepared in step 7, an aluminum nitride thin film is formed (the second electrically insulating and thermally conducting layer 303).

In this step, same process parameters as those in step 2 are adopted, which will not be further described.

Similar to the first embodiment, steps 7 and 8 may be repeated for many times to form a multi-layer composite film structure sealing layer.

Embodiment 3

As shown in FIG. 4, in the OLED in this embodiment, the anode layer 20 is an ITO layer, the metal electrode layer 22 is a Mg:Ag alloy layer, and the first electrically insulating and thermally conducting layer 301 and the second electrically insulating and thermally conducting layer 303 each are aluminum oxide layers with a thickness of about 500 nm; the metal upper electrode 3044 and the metal bottom layer 3041 are of Al, with a thickness of 1000 nm; the P-type semiconductor 3042 is of $Bi_2Te_3$—$Sb_2Te_3$, and the N-type semiconductor 3043 is of $Bi_2Te_3$—$Bi_2Se_3$, both with a thickness of about 1500 nm.

The method for manufacturing the OLED may include the following steps:

1. The anode layer 20, the organic function layer 21 and the metal electrode layer 22 are successively formed on the substrate 1 to complete the light emitting section 2.

2. On the metal electrode layer 22, an aluminum oxide thin film is formed by radio frequency magnetron reactive sputtering.

In particular, highly pure Al is used for the target, highly pure $O_2$ is used as a reacting gas, the radio-frequency power is 200 W, the sputtering atmospheric pressure is 0.5 Pa, the target-substrate distance is 70 mm, the $O_2$ flow rate is 1.0 sccm, the Ar flow rate is 10.0 sccm, the substrate temperature is room temperature, and the deposition thickness is 500 nm.

3. On the aluminum oxide film formed in step 2, a dense high thermometric conductivity Ag metal layer is formed by magnetron sputtering to form a sealing layer together with the aluminum oxide to block corrosion of the OLED by water and oxygen and further enhance toughness of the composite sealing layer.

In order to enhance sealing effect, steps 3 and 4 may be repeated for many times to form a multi-layer composite film structure sealing layer (the first electrically insulating and thermally conducting layer 301).

4. On the multi-layer composite film packaging layer, a layer of dense high thermometric conductivity Al metal array (a plurality of metal bottom electrode 3041) is formed by a shadow mask process with magnetron sputtering.

5. On the Al metal array formed in step 4, with a shadow mask process, a P-type semiconductor array (a plurality of P-type semiconductor 3042) is formed with a radio frequency magnetron sputtering method.

For example, the target for the radio frequency magnetron sputtering is a binary solid solution alloy $Bi_2Te_3$—$Sb_2Te_3$, wherein the sputtering power is 100 W, the sputtering atmospheric pressure is 3 Pa (Ar pressure), the sputtering time is 60 minutes, and the film thickness is 1500 nm.

6. On the Al metal array formed in step 4, with a shadow mask process, an N-type semiconductor array (a plurality of N-type semiconductor 3042) is formed with a radio frequency magnetron sputtering method.

The target is a binary solid solution alloy $Bi_2Te_3$—$Sb_2Se_3$, wherein the sputtering power is 120 W, the sputtering atmospheric pressure is 2 Pa (Ar pressure), the sputtering time is 40 minutes, and the film thickness is 1500 nm.

7. An aluminum oxide film array is formed with a shadow mask process to form the insulating isolation sections in gaps between the P-type semiconductor and the N-type semiconductor of same one semiconductor refrigerating unit and between adjacent semiconductor refrigerating units 304.

In this step, same process parameters as those in step 2 may be adopted, which will not be further described.

8. With a shadow mask process, an Al metal array (a plurality of metal upper electrodes 3044) is formed on the P-type semiconductor array and the N-type semiconductor array with a magnetron sputtering method.

9. On the Al metal array prepared in step 8, an aluminum oxide thin film is formed (the second electrically insulating and thermally conducting layer 303).

In this step, same process parameters as those in step 2 are adopted, which will not be further described.

10. A metal foil is used to package the device.

Embodiment 4

As shown in FIG. 4, in the OLED in this embodiment, the anode layer 20 is an ITO layer, the metal electrode layer 22 is a Mg:Ag alloy layer, and the first electrically insulating and thermally conducting layer 301 and the second electrically insulating and thermally conducting layer 303 are diamond-like carbon layer with a thickness of about 500 nm; the metal upper electrode 3044 and the metal bottom layer 3041 are of Al, with a thickness of 1000 nm; the P-type semiconductor 3042 is of ternary solid solution $Bi_2Te_3$—$Sb_2Te_3$—$Sb_2Se_3$, and the N-type semiconductor 3043 is of ternary solid solution $Bi_2Te_3$—$Sb_2Te_3$—$Sb_2Se_3$, both with a thickness of about 1500 nm.

The preparation method is similar to that of embodiment 3, expect for the materials for the P-type semiconductor 3042 and the N-type semiconductor 3043, which will not be described further.

Comparison Example 1

The OLED has no semiconductor thermoelectric refrigerating section integrated while the light emitting section is formed with the same method as that of aforementioned embodiments 1 to 3.

Performance Test

Embodiments 1, 2, 3, 4 and the comparison example 1 are tested for working temperature and life with test results as shown in Table 1:

TABLE 1

| Embodiment 1 | | Embodiment 2 | | Embodiment 3 | | Embodiment 4 | | Comparison example 1 | |
| --- | --- | --- | --- | --- | --- | --- | --- | --- | --- |
| Working Temp. | Service Life | Working Temp. | Service Life | Working Temp. | Service Life | Working Temp. | Service Life | Working Temp. | Service Life |
| 5° C. | 12000 hrs. | 8° C. | 11000 hrs. | 6° C. | 11000 hrs. | 7° C. | 15000 hrs. | 55° C. | 8000 hrs. |

As shown in Table 1, the OLEDs provided in embodiments of the present invention have lower working temperature and longer service life, that is, it is possible to effectively improve heat dissipation of the light emitting devices to extend service life of the light emitting devices.

What are described above is related to the illustrative embodiments of the disclosure only and not limitative to the scope of the disclosure; the scopes of the disclosure are defined by the accompanying claims.

The invention claimed is:

1. A light emitting device comprising a substrate on which a light emitting section is disposed, wherein,
the light emitting device further comprises a semiconductor thermoelectric refrigerating section integrated therein, the semiconductor thermoelectric refrigerating section being disposed on the light emitting section; and
the semiconductor thermoelectric refrigerating section has a cold end close to the light emitting section and a hot end away from the light emitting section;
the semiconductor thermoelectric refrigerating section comprises a first electrically insulating and thermally conducting layer, a semiconductor thermopile layer, and second electrically Insulating and thermally conducting layer, the first electrically insulating and thermally conducting layer is directly disposed on the light emitting section, the semiconductor thermopile layer is disposed on the first electrically insulating and thermally conducting layer, and the second electrically insulating and thermally conducting layer is disposed on the semiconductor thermopile layer;
the light emitting device is an organic light-emitting diode (OLED); the light emitting section comprises an anode layer, an organic function layer and a metal electrode layer: the anode layer is disposed on the substrate, the organic function layer is disposed on the anode layer, and the metal electrode layer is disposed on the organic function layer; and the first electrically Insulating and thermally conducting layer is directly disposed on the metal electrode layer.

2. The light emitting device according to claim 1, wherein, the substrate having the light emitting section and the semiconductor thermoelectric refrigerating section provided on the substrate is packaged with a multi-layer composite film having repeated units each having a metal layer and an electrically insulating and thermally conducting layer, and the second electrically insulating and thermally conducting layer of the semiconductor thermoelectric refrigerating section is shared by the multi-layer composite film.

3. The light emitting device according to claim 2, wherein, the semiconductor thermopile layer comprises at least one semiconductor refrigerating unit each comprising a metal bottom electrode, a P-type semiconductor, and N-type semiconductor, and a metal upper electrode.

4. The light emitting device according to claim 3, wherein, the metal bottom electrode is disposed on the first electrically insulating and thermally conducting layer,
the P-type semiconductor and the N-type semiconductor are disposed on the metal bottom electrode, and a bottom of the P-type semiconductor and a bottom of the N-type semiconductor are connected through the metal bottom electrode; and
the metal upper electrode is disposed on the top of the P-type semiconductor and on the top of the N-type semiconductor.

5. The light emitting device according to claim 2, wherein, the semiconductor thermoelectric refrigerating section comprises a plurality of semiconductor refrigerating units; and
the plurality of semiconductor refrigerating units are connected in series, in parallels or in combination thereof via the metal upper electrode.

6. The light emitting device according to claim 3, wherein insulating isolation sections are disposed between the P-type semiconductor and the N-type semiconductor of same one the semiconductor refrigerating unit and between adjacent the semiconductor refrigerating units.

7. The light emitting device according to claim 2, wherein, a material for the P-type semiconductor is one of the following materials or any combination thereof:
bismuth telluride binary solid solution ($Bi_2Te_3$—$Sb_2Te_3$), bismuth telluride ternary solid solution ($Bi_2Te_3$—$Sb_2Te_3$—$Sb_2Se_3$), P-type Ag(1-x)Cu(x)TiTe, and YBaCuO superconducting material;
a material for the N-type semiconductor is one of the following materials or any combination thereof:
bismuth telluride binary solid solution ($Bi_2Te_3$—$Sb_2Te_3$), bismuth telluride ternary solid solution ($Bi_2Te_3$—$Sb_2Te_3$—$Sb_2Se_3$), N-type Bi—Sb alloy, and YBaCuO superconducting material.

8. The light emitting device according to claim 4, wherein insulating isolation sections are disposed between the P-type semiconductor and the N-type semiconductor of same one the semiconductor refrigerating unit and between adjacent the semiconductor refrigerating units.

9. A method for manufacturing the light emitting device comprising:
preparing a light emitting section on a substrate;
preparing a semiconductor thermoelectric refrigerating section on the light emitting section prepared on the substrate, the semiconductor thermoelectric refrigerating section comprising a cold end close to the light emitting section and a hot end away from the light emitting section; and
wherein the light emitting device is an organic light-emitting diode (OLED); the light emitting section comprises an anode layer, an organic function layer and a metal electrode layer; the anode layer is disposed on the substrate, the organic function layer is disposed on the anode layer, and the metal electrode layer is disposed on the organic function layer, and the semiconductor thermoelectric refrigerating section is prepared directly on the light emitting section prepared on the substrate.

10. The method according to claim 9, wherein preparing the semiconductor thermoelectric refrigerating section on the light emitting section prepared on the substrate comprises:
depositing a first electrically insulating and thermally conducting layer directly on the light emitting section;
preparing a metal bottom electrode with a shadow mask process on the first electrically insulating and thermally conducting layer;
preparing a p-type semiconductor and an N-type semiconductor respectively by a shadow mask process on the metal bottom electrode;
preparing a metal upper electrode with a shadow mask process on the p-type semiconductor and the N-type semiconductor; and
depositing a second electrically insulating and thermally conducting layer on the metal upper electrode.

11. The method according to claim 9, further comprising:
packaging the substrate with the light emitting section and the semiconductor thermoelectric refrigerating section prepared on the substrate with a multi-layer composite film having repeated units each having a metal layer and an electrically insulating and thermally conducting layer, and the second electrically insulating and thermally conducting layer of the semiconductor thermoelectric refrigerating section is shared by the multi-layer composite film.

* * * * *